United States Patent
Chen et al.

(10) Patent No.: US 10,222,996 B2
(45) Date of Patent: Mar. 5, 2019

(54) READ OPERATION AND SOFT DECODING TIMING

(71) Applicant: Western Digital Technologies, Inc., Irvine, CA (US)

(72) Inventors: Niang-Chu Chen, Irvine, CA (US); Jun Tao, Ladera Ranch, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 36 days.

(21) Appl. No.: 15/426,949

(22) Filed: Feb. 7, 2017

(65) Prior Publication Data

US 2018/0225041 A1 Aug. 9, 2018

(51) Int. Cl.
| | | |
|---|---|---|
| *G06F 3/00* | (2006.01) | |
| *G06F 3/06* | (2006.01) | |
| *G06F 11/10* | (2006.01) | |
| *G11C 16/10* | (2006.01) | |
| *H03M 13/11* | (2006.01) | |

(Continued)

(52) U.S. Cl.
CPC .............. *G06F 3/061* (2013.01); *G06F 3/064* (2013.01); *G06F 3/0619* (2013.01); *G06F 3/0659* (2013.01); *G06F 3/0679* (2013.01); *G06F 11/1068* (2013.01); *G11C 16/10* (2013.01); *H03M 13/1111* (2013.01); *H03M 13/6502* (2013.01); *G11C 16/08* (2013.01);
(Continued)

(58) Field of Classification Search
None
See application file for complete search history.

(56) References Cited

U.S. PATENT DOCUMENTS

| | | | |
|---|---|---|---|
| 7,656,707 B2 | 2/2010 | Kozlov | |
| 9,007,854 B1 * | 4/2015 | Nemati Anaraki | G06F 11/10 365/189.09 |

(Continued)

FOREIGN PATENT DOCUMENTS

| | | |
|---|---|---|
| EP | 2822184 A1 | 1/2015 |
| WO | WO-2011/113034 A2 | 9/2011 |

OTHER PUBLICATIONS

Zhao et al., "Reducing latency overhead caused by using LDPC codes in NAND flash memory," EURASIP Journal on Advances in Signal Processing, Sep. 19, 2012, retrieved from http://asp.eurasipjournals.springeropen.com/articles/10.1186/1687-6180-2012-203.

(Continued)

*Primary Examiner* — Daniel F. McMahon
(74) *Attorney, Agent, or Firm* — Morgan, Lewis & Bockius LLP

(57) ABSTRACT

The subject technology provides reduced overhead in Low Density Parity Check decoding operations. A method includes receiving a hard decode fail indication that decoding first raw data read from non-volatile memory in response to a first read command using a first set of voltages failed. The first read command comprises a first set of read operations. The method includes issuing to the non-volatile memory a second read command for the data using a second set of voltages. The second read command comprises a second set of read operations. The method includes issuing to the decoder, for processing in parallel with the second read command, at least one soft decoding request using soft information based on the first raw data. The method includes receiving from the decoder a success indication of successful decoding.

21 Claims, 3 Drawing Sheets

(51) Int. Cl.
*H03M 13/00* (2006.01)
*G11C 16/08* (2006.01)
*G11C 16/26* (2006.01)
*G11C 29/52* (2006.01)
*G11C 16/32* (2006.01)
*G11C 29/04* (2006.01)

(52) U.S. Cl.
CPC .............. *G11C 16/26* (2013.01); *G11C 16/32* (2013.01); *G11C 29/52* (2013.01); *G11C 2029/0411* (2013.01)

(56) References Cited

U.S. PATENT DOCUMENTS

| | | | |
|---|---|---|---|
| 9,117,529 B2 | 8/2015 | Karakulak et al. | |
| 9,239,754 B2* | 1/2016 | Wu | G06F 11/1048 |
| 9,407,294 B2 | 8/2016 | Hanham et al. | |
| 2012/0224420 A1* | 9/2012 | Sakurada | G11C 11/5642 |
| | | | 365/185.03 |
| 2012/0240007 A1* | 9/2012 | Barndt | H03M 13/1108 |
| | | | 714/758 |
| 2013/0135927 A1* | 5/2013 | Jeon | G06F 11/1072 |
| | | | 365/185.03 |
| 2013/0215678 A1* | 8/2013 | Yang | G11C 16/349 |
| | | | 365/185.03 |
| 2014/0185377 A1* | 7/2014 | Kim | G11C 16/26 |
| | | | 365/185.03 |
| 2014/0281828 A1 | 9/2014 | Micheloni et al. | |
| 2015/0043282 A1* | 2/2015 | Shin | G11C 16/3495 |
| | | | 365/185.21 |
| 2015/0194983 A1 | 7/2015 | Varanasi et al. | |
| 2015/0278015 A1* | 10/2015 | Haratsch | G06F 11/1012 |
| | | | 714/764 |
| 2015/0365106 A1 | 12/2015 | Wu et al. | |
| 2016/0077914 A1* | 3/2016 | Zeng | H03M 13/1108 |
| | | | 714/764 |
| 2017/0123901 A1* | 5/2017 | Zhao | G06F 11/1068 |

OTHER PUBLICATIONS

Wang et al., "Soft Information for LDPC Decoding in Flash: Mutual-Information Optimized Quantization," IEEE Globecom 2011 Proceedings, retrieved from https://people.eecs.berkeley.edu/~courtade/pdfs/WangEtAl_Globecom2011.pdf.

Zhang et al., "REAL: A Retention Error Aware LDPC Decoding Scheme to Improve NAND Flash Read Performance," 2016, retrieved from http://storageconference.us/2016/Papers/REAL.pdf.

* cited by examiner

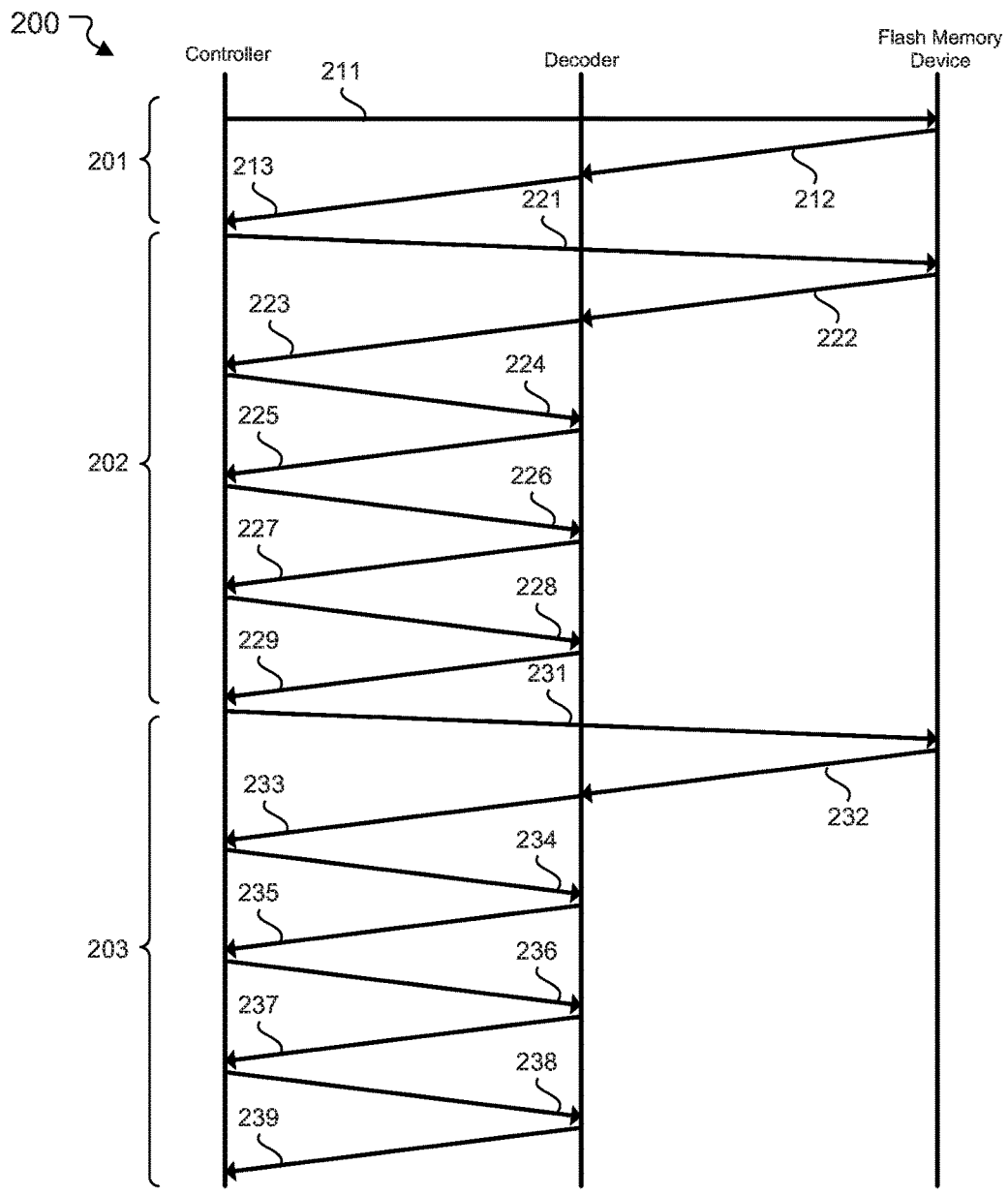
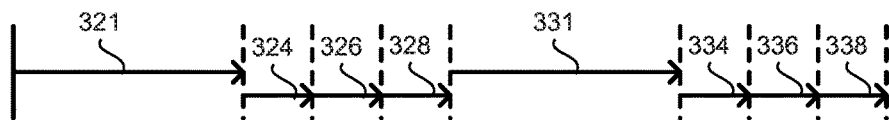
FIG. 3A
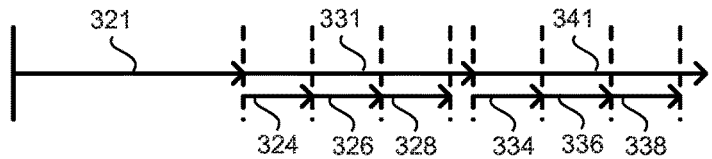
FIG. 3B

READ OPERATION AND SOFT DECODING TIMING

TECHNICAL FIELD

The subject technology relates generally to data storage solutions that utilize error correction coding (ECC).

BACKGROUND

Data storage systems (for example, solid state drives (SSD), hard disk drives, and the like) may use Low Density Parity Check (LDPC) to correct errors that occur when storing and reading or sending and receiving information. For instance, for a normal read operation for an SSD, raw data read from the flash memory device is passed through decoding before the SSD controller returns the data to a host. If the decoding fails, the controller invokes an error correction subroutine. The error correction subroutine involves using different voltages to read from the flash memory device, and trying different Log Likelihood Ratio (LLR) tables for LDPC decoding.

SUMMARY

The subject technology reduces overhead time during an error correction subroutine in a flash storage system by issuing a raw read request and performing soft decoding during the raw read request.

According to aspects of the subject technology, a method for managing data decoding is provided. The method includes receiving a hard decode fail indication that decoding first raw data read from non-volatile memory in response to a first read command using a first set of voltages failed. The first read command comprises a first set of read operations. The method includes issuing to the non-volatile memory a second read command for the data using a second set of voltages. The second read command comprises a second set of read operations. The method includes issuing to the decoder, for processing in parallel with the second read command, at least one soft decoding request using first soft information based on the first raw data. The method includes receiving from the decoder a success indication of successful decoding.

According to other aspects of the subject technology, a flash storage system is provided. The flash storage system includes means for receiving a hard decode fail indication that decoding first raw data read from non-volatile memory in response to a first read command using a first set of voltages failed. The first read command comprises a first set of read operations. The flash storage system includes means for issuing to the non-volatile memory a second read command for the data using a second set of voltages. The second read command comprises a second set of read operations. The flash storage system includes means for issuing to the decoder, for processing in parallel with the second read command, at least one soft decoding request using first soft information based on the first raw data. The flash storage system includes means for receiving from the decoder a success indication of successful decoding.

According to other aspects of the subject technology, a flash storage system is provided. The flash storage system includes a plurality of flash memory devices, a decoder, and a controller. The controller is configured to receive a hard decode fail indication that decoding first raw data read from non-volatile memory in response to a first read command using a first set of voltages failed. The first read command comprises a first set of read operations. The controller is configured to issue to the non-volatile memory a second read command for the data using a second set of voltages. The second read command comprises a second set of read operations. The controller is configured to issue to the decoder, for processing in parallel with the second read command, at least one soft decoding request using first soft information based on the first raw data. The controller is configured to receive from the decoder a success indication of successful decoding.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings:

FIG. 2 is a diagram illustrating read and decode operations of an error correction routine for a flash storage system according to aspects of the subject technology.

FIG. 3A is a diagram illustrating read and decode operation timing of the diagram of FIG. 2.

FIG. 3B is a diagram illustrating read and decode operation timing according to aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology Like components are labeled with identical element numbers for ease of understanding.

Generally, data is encoded when written to a non-volatile memory, such as a flash memory device, and to read the data a decoder decodes raw data read from the flash memory device. For example, if the host requests data in a read command, or the controller requests data as part of a maintenance operation, the controller sends a read request to the flash memory. The flash memory reads raw data corresponding to the requested data, and the decoder decodes the raw data. The controller returns the decoded raw data to the host. However, if the decoding fails, the controller invokes an error correction routine. The error correction routine involves stages of reading raw data from the flash memory device and decoding the read raw data, using different voltages for reading for each successive stage, as will be described in more detail below.

According to aspects of the subject technology, a time to complete the error correction routine may be reduced. A read command for a given stage may include a set of read operations, each using a different voltage. The flash memory device may be reprogrammed for each different voltage, or the flash memory device may be capable of cycling through different voltages. After the read command for the current stage of the error correction routine is complete, soft decoding requests for the read raw data are issued. Before the soft decoding requests for the current stage complete, a read command for the next stage is issued, such that the read command is performed in parallel with the soft decoding. Thus, if the soft decoding for the current stage fails, a time waiting for the next stage's read command to complete is reduced.

Figure 1:
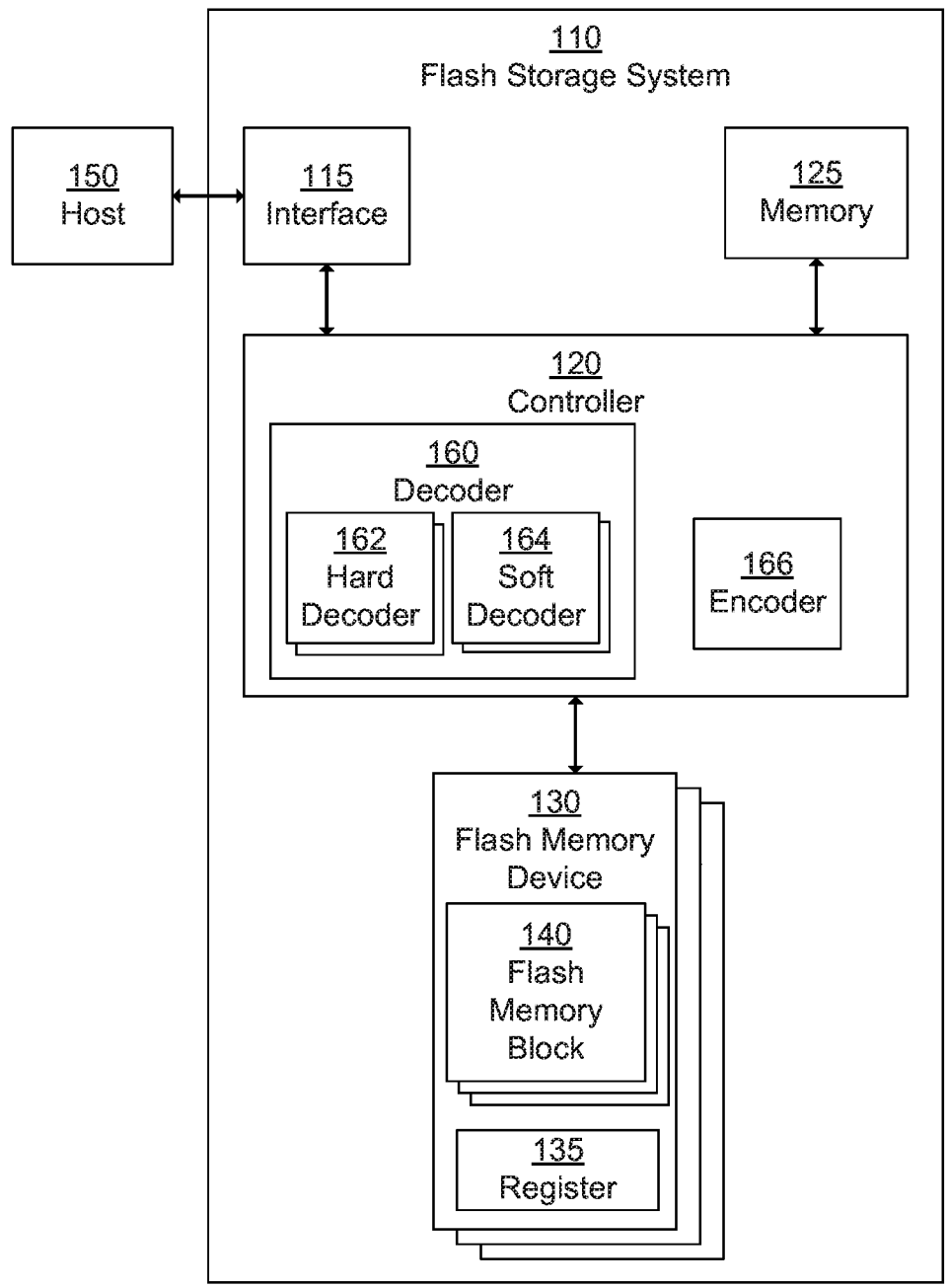
FIG. 1 is a block diagram illustrating components of a flash storage system according to aspects of the subject technology.

FIG. 1 is a block diagram illustrating components of a flash storage system 110 according to aspects of the subject technology. As depicted in FIG. 1, the flash storage system 110 includes an interface 115, a controller 120, a memory 125, a decoder 160, an encoder 166, and flash memory devices 130. The interface 115 facilitates communication of data, commands, and/or control signals between the flash storage system 110 and a host 150. The controller 120 controls the operation of the flash storage system 110 to store and retrieve data in the flash memory devices 130 in accordance with commands received from the host 150. The controller 120 may include a processor. The memory 125, which may be a random access memory (RAM), provides temporary storage space for the controller 120 to process commands and transfer data between the host 150 and the flash memory devices 130. The decoder 160, which may include memory, registers, logic gates, one or more processors, and may be integrated with or separate from the controller 120, decodes raw data. The encoder 166, which may include memory, registers, logic gates, one or more processors, and may be integrated with or separate from the controller 120, encodes data to be written to the flash memory device 130. The operation of each of these components is described in more detail below.

The interface 115 provides physical and electrical connections between the host 150 and the flash storage system 110. The interface 115 is configured to facilitate communication of data, commands, and/or control signals between the host 150 and the flash storage system 110 via the physical and electrical connections. The connection and the communications with the interface 115 may be based on a standard interface such as Universal Serial Bus (USB), Small Computer System Interface (SCSI), Serial Advanced Technology Attachment (SATA), etc. Alternatively, the connection and/or communications may be based on a proprietary interface, although the subject technology is not limited to any particular type of interface.

The host 150 may be a computing device, such as a computer/server, a smartphone, or any other electronic device that reads data from and writes data to the flash storage system 110. The host 150 may have an operating system or other software that issues read and write commands to the flash storage system 110. The flash storage system 110 may be integrated with the host 150 or may be external to the host 150. The flash storage system 110 may be wirelessly connected to the host 150, or may be physically connected to the host 150.

FIG. 1 shows multiple flash memory devices 130. The flash storage system 110 may include one or more flash memory devices 130 and is not limited to a particular number of flash memory devices 130. The flash memory devices 130 may each include a single flash memory chip or die. The flash memory devices 130 may be organized among multiple channels through which data is read from and written to the flash memory devices 130 by the controller 120, or coupled to a single channel. The flash memory devices 130 may be implemented using NAND flash memory. The flash memory devices 130 may each comprise one or more registers 135 for storing operating parameters of the respective flash memory devices 130. The operating parameters may include: read operation parameters such as read voltages; write operation parameters such as initial pulse value, incremental pulse value, and pulse width; and erase operation parameters such as initial pulse value, incremental pulse value, and pulse width.

The flash memory devices 130 comprise multiple memory cells distributed into storage blocks such as flash memory blocks 140. The flash memory devices 130 may have one or more flash memory blocks 140, and the flash memory devices 130 may each have the same or different numbers of flash memory blocks 140. The flash memory blocks 140 may be referred to as data blocks or memory blocks and are addressable by the controller 120 using a physical block address. Each of the flash memory blocks 140 is further divided into multiple data segments or pages addressable by the controller 120 using a physical page address or offset from a physical block address of the storage block containing the referenced page. The pages may store sectors or other host data units. The flash memory blocks 140 represent the units of data that are erased within the flash memory devices 130 in a single erase operation. The pages represent the units of data that are read from or written to the flash memory devices 130 in a read or write operation. Although the flash memory devices 130 are described in terms of blocks and pages, other terminology may be used to refer to these data units within a flash storage device.

The subject technology is not limited to any particular capacity of flash memory. For example, storage blocks may each comprise 32, 64, 128, or 512 pages, or any other number of pages. Additionally, pages may each comprise 512 bytes, 2 KB, 4 KB, or 32 KB, for example. The sectors may each comprise, for example, 512 bytes, 4 KB, or other sizes. There may be one or more sectors per page.

In FIG. 1, the memory 125 represents a volatile memory coupled to and used by the controller 120 during operation of the flash storage system 110. The controller 120 may buffer commands and/or data in the memory 125. The controller 120 also may use the memory 125 to store address mapping tables or lookup tables used to convert logical addresses used by the host 150 into virtual and/or physical addresses corresponding to blocks and pages of the flash memory devices 130. Other types of tables, data, status indicators, etc. used to manage the flash memory devices 130 may also be stored in the memory 125 by the controller 120. For example, LLR tables may be stored in the memory 125. The memory 125 may be implemented using dynamic random access memory (DRAM), static random access memory (SRAM), or other types of volatile random access memory without departing from the scope of the subject technology. The controller 120 may periodically store the contents of the memory 125 into one or more designated flash memory blocks 140, such as before the flash storage system 110 is powered down.

The controller 120 manages the flow of data between the host 150 and the flash memory devices 130. The controller 120 is configured to receive commands and data from the host 150 via the interface 115. For example, the controller 120 may receive data and a write command from the host 150 to write the data in the flash memory devices 130. The controller 120 is further configured to send data to the host 150 via the interface 115. For example, the controller 120 may read data from the flash memory devices 130 and send the data to the host 150 in response to a read command. The controller 120 is further configured to manage data stored in the flash memory devices 130 and the memory 125 based on internal control algorithms or other types of commands that may be received from the host 150. For example, the controller 120 is configured to perform operations such as garbage collection (GC), error correction, and wear leveling. Those skilled in the art will be familiar with other operations performed by a controller in a flash storage device, which will not be described in detail herein.

The controller 120 may be implemented with a general purpose processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. The controller 120 may perform the operations and functions described herein by executing one or more sequences of instructions stored on a machine/computer readable medium. The machine/computer readable medium may be the flash memory devices 130, the memory 125, or other types of media from which the controller 120 can read instructions or code. For example, flash storage system 110 may include a read only memory (ROM), such as an EPROM or EEPROM, encoded with firmware/software comprising one or more sequences of instructions read and executed by the controller 120 during the operation of the flash storage system 110.

The decoder 160 may be implemented with a general purpose processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. The decoder 160 may be integrated with the controller 120, or may be separate. The decoder 160 may be configured to use LDPC. The decoder 160 may be configured to use additional or alternative decoding schemes. The decoder 160 includes one or more hard decoders 162 and one or more soft decoders 164. The hard decoders 162 may be decoders that are reserved for hard decoding. Hard decoding limits the read bit values to either a "1" or a "0." Soft decoding, on the other hand, uses a range of values pulled from an LLR table, for example, to provide reliability or confidence measures that the read values are correct. The LLR table allows the confidence values to be looked up based on the read outcomes. The soft decoders 164 may be decoders that are reserved for soft decoding. In certain implementations, the number of hard decoders 162 and the number of soft decoder 164 may be dynamically reserved from a pool of available decoders.

FIG. 2 shows a diagram 200 of a read operation and error correction routine. Read operation 201 is followed by first error correction stage 202, which is followed by second error correction stage 203, if needed.

The read operation 201 starts with a request for data, for example from the host 150 or the controller 120. The controller 120 sends a read command 211 to the appropriate flash memory device 130 storing the requested data. The flash memory device 130 provides raw data, for example in a buffer, which the decoder 160 decodes for a hard decode operation 212. More specifically, the hard decoder 162 may decode the data for the hard decode operation 212. The decoder 160 returns an indication 213 to the controller 120 after completing the hard decode operation 212. If the indication 213 indicates successful decoding, the controller 120 returns the decoded data to the host 150 in response to the request for data. However, if the indication 213 indicates failure, the controller 120 invokes an error correction routine.

The controller starts with the first error correction stage 202 by sending a read command 221 to the flash memory device 130. The read command 221 instructs the flash memory device 130 to read using a first stage set of voltages, which is a different set of voltages than, for example, a default set of voltages used for the read command 211. The first stage set of voltages may include some or all of the default set of voltages, and/or may include voltages not in the default set of voltages. The voltages of the first stage set of voltages may correspond to a base read level voltage and one or more offset voltages from the base read level voltage. The read command 221 may include a plurality of read operations, each read operation using one of the voltages from the first stage set of voltages. The first stage set of voltages may be stored, for example in the memory 125 or the register 135. The controller 120 may program the flash memory device 130 to read at a respective voltage for each read operation of the read command 221, for example by setting values in the register 135 before issuing each read operation.

The flash memory device 130 provides first raw data read using the first stage set of voltages, which the decoder 160 may optionally decode for a hard decode operation 222. The controller 120 receives an indication 223 that the first raw data is available. In implementations in which the first raw data is hard decoded, the decoder 160 returns an indication 223 to the controller 120. If the indication 223 indicates successful decoding, the controller 120 provides the decoded data. Otherwise, if the indication 223 indicates failure, the controller 120 continues the error correction routine.

For each error correction stage, the controller 120 may issue one or more soft decoding requests if the hard decoding fails. For example, three soft decoding requests may be issued, although in other implementations, more or less soft decoding requests may be issued. The soft decoding requests may further include additional parameters, such as LLR tables, which may differ amongst the soft decoding requests.

The controller 120 initiates soft decoding of the first raw data. The controller 120 sends a soft decoding request 224 to the decoder 160. The soft decoding request 224 may be a soft LDPC request, sent with the first raw data read in response to the read command 221. The soft decoding request 224 includes soft information that may be obtained from the first LLR table for the first error correction stage 202.

In an LDPC coding scheme, for example, an LLR may include the logarithm of a ratio between the probability of a bit being "0" or "1." A positive LLR may generally indicate that a signal read from a flash memory cell may likely be a 0-bit, and a negative LLR may generally indicate that the signal read from the memory cell may likely be a 1-bit. Each assigned LLR may correspond to a bit value. In one example, a bit value having an assigned LLR equal to five may be more likely to be a 0 than a bit having an assigned LLR equal to 1. A bit having an assigned LLR equal to zero may be equally likely to be a 1 or a 0.

The decoder 160 may use an LLR table to decode the first raw data. The first raw data may include one or more sets of bit values, each set having been read using one of the voltages of a set of voltages. For each bit, the corresponding bits across the sets of bit values correspond to corresponding confidence value in the LLR table. With a larger number of sets of bit values, the LLR table may be larger to account for more confidence values. The LLR table provides soft information that the decoder 160 may use for soft decodes. The decoder 160 returns an indication 225 to the controller 120 after the soft decoding is complete. If the indication 225 indicates success, the controller 120 provides the decoded data to the requestor, such as the host 150. Otherwise, if the indication 225 indicates failure, the controller 120 continues with the error correction routine.

The controller 120 issues a soft decoding request 226 to the decoder 160. The soft decoding request 226 may be a soft LDPC request, sent with the first raw data. The soft decoding request 226 may further include a second set of confidence values, such as a second LLR table for the first error correction stage 202. The second LLR table may include confidence values having different confidence values than the confidence values of the first LLR table. The different confidence values may be based on different algorithms for calculating the confidence values.

The decoder 160 returns an indication 227 to the controller 120 after the soft decoding is complete. If the indication 227 indicates success, the controller 120 provides the decoded data to the requestor, such as the host 150. Otherwise, if the indication 227 indicates failure, the controller 120 continues with the error correction routine.

The controller 120 issues a soft decoding request 228 to the decoder 160. The soft decoding request 228 may be a soft LDPC request, sent with the first raw data. The soft decoding request 228 may further include a third set of confidence values, such as a third LLR table for the first error correction stage 202.

The decoder 160 returns an indication 229 to the controller 120 after the soft decoding is complete. If the indication 229 indicates success, the controller 120 provides the decoded data to the requestor, such as the host 150. Otherwise, if the indication 229 indicates failure, the controller 120 continues with the error correction routine.

The error correction routine may include one or more stages. For example, two stages are described herein, although the error correction routine may include more stages, for example eight stages or ten stages. Each stage begins with a read command using a set of voltages corresponding to the stage. For example, a set of voltages may include one or more subsets of the other sets of voltages and/or may include voltages that are not in the other sets of voltages. The sets of voltages may be determined based on performance characteristics of the flash memory devices 130, such as program/erase cycles, error count, etc., and may be stored in, for example, the memory 125. The set of voltages for a current read command may be programmed into the register 135 before the flash memory device 130 performs the read operation.

Each stage includes soft decoding requests. The soft decoding requests for a given stage may include raw data read from the current stage, as well as raw data read from previous stages. For example, the raw data read for each stage may be stored in a buffer of the memory 125 until the error correction routine ends. For each successive stage, the soft decoding requests may reference the buffers holding raw data read for the current stage as well as prior stages. By using more raw data buffers, the granularity of the associated voltage ranges increases. Using the raw data buffers of previous stages may obviate the need to reread data using a previously used voltage. For example, if a previous stage read data using 1.0V, and the current stage requires data read at 1.0V and 1.1V, then the data previously read at 1.0V may be used rather than rereading the data using 1.0V. The increased granularity of voltage ranges, corresponding to the increased number of voltages used for reading data, may require a larger LLR table holding additional confidence values for the voltage ranges. Each stage may perform a limited number of soft decodes, such as three, although more or less soft decodes may be performed and may correspond to a number of LLR tables available for each stage. Each soft decoding request for each stage uses soft information based on a different LLR table. Thus, there may be, for example, three different LLR tables for each stage.

After all soft decoding requests, for example three soft decoding requests, are complete for the first error correction stage 202, the controller continues to the second error correction stage 203.

The controller starts the second error correction stage 203 by sending a read command 231 to the flash memory device 130. The read command 231 instructs the flash memory device 130 to read using a second stage set of voltages, which is a different set of voltages than the default set of voltages and different than the first stage set of voltages. The second stage set of voltages may be stored, for example in the memory 125 or the register 135, and corresponds to the second error correction stage 203. The flash memory device 130 returns second raw data read using the second stage set of voltages, which the decoder 160 may decode for a hard decode operation 232. The controller 120 receives an indication 233 that the second raw data is available. In implementations in which the second raw data is decoded, the decoder 160 returns the indication 233 to the controller 120. If the indication 233 indicates successful decoding, the controller 120 provides the decoded data. Otherwise, if the indication 233 indicates failure, the controller 120 continues the error correction routine.

The controller 120 initiates soft decoding of the second raw data. The controller 120 sends a soft decoding request 234 to the decoder 160. The soft decoding request 234 may be a soft LDPC request, sent with the first raw data and the second raw data. The soft decoding request 234 may further include a set of confidence values, such as a first LLR table for the second error correction stage 203.

The LLR tables for the second error correction stage 203 may each be a matrix having confidence values that account for the first raw data and the second raw data. The decoder 160 returns an indication 235 to the controller 120 after the soft decoding is complete. If the indication 235 indicates success, the controller 120 provides the decoded data to requestor, such as the host 150. Otherwise, if the indication 235 indicates failure, the controller 120 continues with the error correction routine.

The controller 120 issues a soft decoding request 236 to the decoder 160. The soft decoding request 236 may be a soft LDPC request, sent with the first raw data and the second raw data. The soft decoding request 236 may further include a second set of confidence values, such as a second LLR table for the second error correction stage 203.

The decoder 160 returns an indication 237 to the controller 120 after the soft decoding is complete. If the indication 237 indicates success, the controller 120 returns the decoded data to the host 150. Otherwise, if the indication 237 indicates failure, the controller 120 continues with the error correction routine.

The controller 120 issues a soft decoding request 238 to the decoder 160. The soft decoding request 238 may be a soft LDPC request, sent with the first raw data and the second raw data. The soft decoding request 238 may further include a third set of confidence values, such as a third LLR table for the second error correction stage 203.

The decoder 160 returns an indication 239 to the controller 120 after the soft decoding is complete. If the indication 239 indicates success, the controller 120 returns the decoded data to the host 150. Otherwise, if the indication 239 indicates failure, the controller 120 continues with the error correction routine.

The controller 120 may continue with additional error correction stages until decoding is successful, or all error correction stages have been performed. When all error stages have been performed, the controller 120 may indicate a read failure.

FIG. 3A illustrates a timing diagram corresponding to the error correction routine shown in FIG. 2. The controller 120 issues a read command 321 for the first error correction stage. After completion (and hard decoding failure) of the read command 321, the controller issues a soft decoding request 324. If the soft decoding fails, the controller issues a soft decoding request 326. If the soft decoding fails, the controller issues a soft decoding request 328. If the soft decoding fails, the controller starts the second error correction stage and issues a read command 331. After completion (and hard decoding failure) of the read command 331, the controller issues a soft decoding request 334. If the soft decoding fails, the controller issues a soft decoding request 336. If the soft decoding fails, the controller issues a soft decoding request 338. As seen in FIG. 3A, each request is sequentially issued after the failure of the previous request.

Although FIG. 3A is not drawn to scale, the lengths of each line generally correspond to length of time. In other words, read operations from the flash memory device generally take more time than soft decode operations. For example, a read operation from the flash memory device may take more time to complete than three soft decode operations.

FIG. 3B shows a timing diagram corresponding to an error correction routine according to aspects of the subject technology. After the read command 321 completes (and indicates a failure), the controller 120 issues the read command 331. After the controller 120 issues the read command 321, and while the read command 321 is processing, the controller 120 issues the soft decoding request 324. In certain implementations, the controller 120 may instead issue the soft decoding request 324 after the read command 321 completes and issue the read command 321 thereafter. In other words, the read command 321 and the soft decoding request 324 are processed in parallel regardless of order of issuance. Upon failure of the soft decoding request 324, the controller 120 issues the soft decoding request 326. Upon failure of the soft decoding request 326, the controller 120 issues the soft decoding request 328. The soft decoding requests of the current stage are issued and may be completed before the read command for the next stage completes. In other words, the read operation for the next error correction stage may process in parallel and concurrent with the soft decode operations of the current error correction stage. Thus, the wait between completing the soft decodes of the current stage and reading the raw data for the next stage is reduced. If the read command 331 returns failure, the controller 120 may issue the next read request, a read command 341 using a different set of voltages than used in previous read commands.

Figure 4:
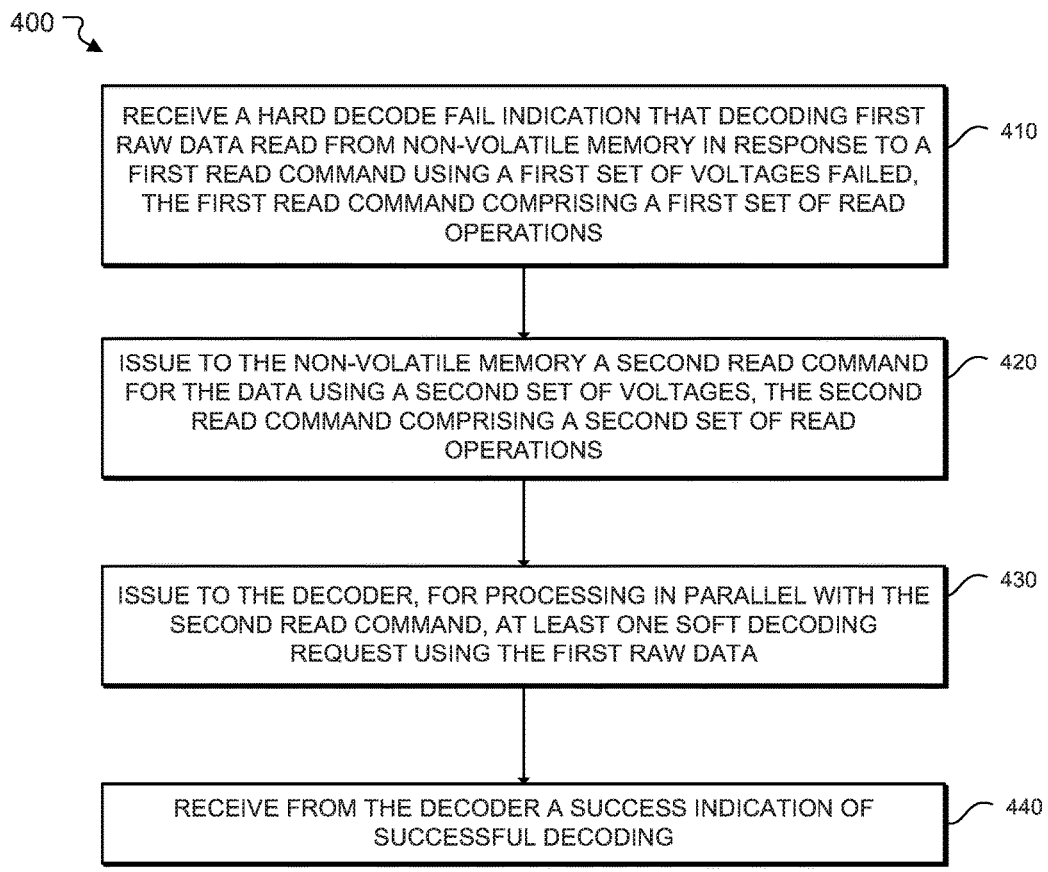
FIG. 4 is a flowchart illustrating a method for reducing overhead in an error correction routine for a flash storage system according to aspects of the subject technology.

The error correction routine of FIG. 3B is discussed further below in reference to FIG. 4. FIG. 4 shows a flowchart 400 of an error correction routine. The host 150 requests data from one of the flash memory devices 130. Alternatively, the controller 120 may request the data for a maintenance operation, such as garbage collection. The controller 120 issues an initial read command to the flash memory device 130, which may be selected based on an address associated with the requested data. The process of FIG. 4 begins with the first error correction stage after the initial read command returns failure, for example the decoder 160 indicates failure of hard decoding.

The controller 120 issues to the flash memory device 130, a first read command using a first set of voltages. The first set of voltages corresponds to the first error correction stage, and differs from the set of voltages used in the initial read command. The decoder 160 decodes first raw data from the flash memory device 130 in response to the first read command. This decoding may be a hard decode, decoded by the hard decoder 162. The hard decoder 162 may access the first raw data from a buffer in the memory 125.

At 410, the controller 120 receives from the decoder 160 a hard decode fail indication that decoding the first raw data failed. At 420, the controller 120 issues to the flash memory device 130, in response to the hard decode fail indication, a second read command for the data using a second set of voltages. The controller 120 may issue, immediately after the read for the first error correction stage fails, the read for the second error correction stage, before issuing soft decodes for the first error correction stage. This allows the read for the second error correction stage to process while the soft decodes for the first error correction stage process, because the time to complete a read from flash memory is greater than the time to complete one or more soft decodes.

At 430, the controller 120 issues to the decoder 160, before the second read command is complete, at least one soft decoding request using the first raw data. The soft decoder 164 may receive and process the at least one soft decoding request. During the second read operation, the controller 120 may ultimately issue more than one soft decoding request, for example all soft decoding requests for the current error correction stage. As described above, the soft decoding requests may each include a set of confidence values such as an LLR table.

At 440, the controller 120 receives from the decoder 160 a success indication of successful decoding. The success indication may come from a successful soft decode, for example in response to the at least soft decoding request issued at 450, or may come from a successful hard decode, for example in response to a hard decode associated with the second read command issued at 440. Once the requested data is successfully decoded, the controller 120 will make the decoded data available to the requestor, for example to the host 150 or the controller 120, regardless of which request of the error correction routine resulted in success.

However, in certain situations the data may be successfully decoded more than once. For example, one of the soft decodes of the current error correction stage may return successfully. Because the read operation for the next error correction stage is being processed in parallel, the read operation for the next error correction stage may also return success upon completion, resulting in two successfully decoded sets of data, which may be the same resulting data.

The controller 120 determines, in response to the success indication, whether the requested data was successfully provided. For example, the controller 120 may maintain a state machine, which may be stored in the memory 125 or the register 135. The state machine may track the state of read requests to the flash memory devices 130. The state machine may have a success flag for each read request to indicate that the data was previously provided. The controller 120 provides the decoded data to the requestor when the requested data was not previously provided to the requestor. For example, the state machine may indicate that the success flag was not set, thus the requested data was not previously provided. Upon providing the decoded data, the controller 120 updates the state machine, for example by setting the corresponding success flag. If the controller 120 receives another success indication of successful decoding the controller 120 will see that the success flag has been set, and will discard the decoded data.

The error correction routine described herein may result in an extra read operation, for example when one of the soft decodes for a current error correction stage returns success during a read operation for the next error correction stage. However, the benefit of the reduced overhead may outweigh the drawback of an extra read operation, particularly near an end of life period for the flash storage system 110, in which a high bit error rate necessitates invoking the error correction routine.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for managing data decoding comprising:
   receiving a hard decode fail indication that decoding first raw data read from non-volatile memory in response to a first read command using a first set of voltages failed, the first read command comprising a first set of read operations;
   issuing to the non-volatile memory a second read command for the data using a second set of voltages, the second read command comprising a second set of read operations, wherein issuing the second read command causes the non-volatile memory to process the second read command;
   issuing to the decoder at least one soft decoding request using first soft information based on the first raw data, wherein issuing the at least one soft decoding request causes the decoder to process the at least one soft decoding request in parallel with the non-volatile memory processing the second read command; and receiving from the decoder a success indication of successful decoding.

2. The method of claim 1, wherein the first soft information is further based on a first set of confidence values.

3. The method of claim 1, further comprising:

receiving one or more soft decode fail indications in response to the at least one soft decoding request using the first soft information;

receiving a second hard decode fail indication that decoding second raw data in response to the second read command failed;

issuing to the non-volatile memory a third read command for the data using a third set of voltages, the third read command comprising one or more third read operations; and issuing to the decoder, for processing in parallel with the third read command, at least one soft decoding request using second soft information based on the first raw data and the second raw data.

4. The method of claim 3, wherein the first soft information is further based on a first set of confidence values and the second soft information is further based on a second set of confidence values.

5. The method of claim 1, wherein issuing the at least one soft decoding request using the first soft information further comprises:

issuing to the decoder a first soft decoding request using the first soft information based on a first set of confidence values;

receiving a first soft decoding failure indication in response to the first soft decoding request; and issuing in response to the first soft decoding failure indication, a second soft decoding request using second soft information based on the first raw data and a second set of confidence values.

6. The method of claim 1, further comprising:

determining, in response to the success indication, whether requested data was successfully provided in response to the at least one soft decoding request; and providing the decoded data when the requested data was not previously provided.

7. The method of claim 6, wherein determining whether the requested data was successfully provided comprises determining whether a success flag indicating that the requested data was provided is set.

8. A flash storage system comprising:

means for receiving a hard decode fail indication that decoding first raw data read from non-volatile memory in response to a first read command using a first set of voltages failed, the first read command comprising a first set of read operations;

means for issuing to the non-volatile memory a second read command for the data using a second set of voltages, the second read command comprising a second set of read operations, wherein issuing the second read command causes the non-volatile memory to process the second read command;

means for issuing to the decoder at least one soft decoding request using first soft information based on the first raw data, wherein issuing the at least one soft decoding request causes the decoder to process the at least one soft decoding request in parallel with the non-volatile memory processing the second read command; and means for receiving from the decoder a success indication of successful decoding.

9. The flash storage system of claim 8, wherein the first soft information is further based on a first set of confidence values.

10. The flash storage system of claim 8, further comprising:

means for receiving one or more soft decode fail indications in response to the at least one soft decoding request using the first soft information;

means for receiving a second hard decode fail indication that decoding second raw data in response to the second read command failed;

means for issuing to the non-volatile memory a third read command for the data using a third set of voltages, the third read command comprising a third set of read operations; and means for issuing to the decoder, for processing in parallel with the third read command, at least one soft decoding request using second soft information based on the first raw data and the second raw data.

11. The flash storage system of claim 10, wherein the at least one soft decoding request using the first soft information is further based on a first set of confidence values and the second soft information is further based on a second set of confidence values.

12. The flash storage system of claim 8, wherein issuing the at least one soft decoding request using the first soft information further comprises:

issuing to the decoder a first soft decoding request using the first soft information based on a first set of confidence values;

receiving a first soft decoding failure indication in response to the first soft decoding request; and issuing in response to the first soft decoding failure indication, a second soft decoding request using second soft information based on the first raw data and a second set of confidence values.

13. The flash storage system of claim 8, further comprising:

means for determining, in response to the success indication, whether requested data was successfully provided in response to the at least one soft decoding request; and means for providing the decoded data when the requested data was not previously provided.

14. The flash storage system of claim 13, wherein determining whether the requested data was successfully provided comprises determining whether a success flag indicating that the requested data was provided is set.

15. A flash storage system comprising:

a plurality of flash memory devices;

a decoder; and a controller configured to:

receive a hard decode fail indication that decoding first raw data read from non-volatile memory in response to a first read command using a first set of voltages failed, the first read command comprising a first set of read operations;

issue to the non-volatile memory a second read command for the data using a second set of voltages, the second read command comprising a second set of read operations, wherein issuing the second read command causes the non-volatile memory to process the second read command;

issue to the decoder at least one soft decoding request using first soft information based on the first raw data, wherein issuing the at least one soft decoding request causes the decoder to process the at least one soft decoding request in parallel with the non-volatile memory processing the second read command; and receive from the decoder a success indication of successful decoding.

16. The flash storage system of claim 15, wherein the first soft information is further based on a first set of confidence values.

17. The flash storage system of claim 15, wherein the controller is further configured to:
receive one or more soft decode fail indications in response to the at least one soft decoding request using the first soft information;
receive a second hard decode fail indication that decoding second raw data in response to the second read command failed;
issue to the non-volatile memory a third read command for the data using a third set of voltages, the third read command comprising a third set of read operations; and
issue to the decoder, for processing in parallel with the second read command, at least one soft decoding request using second soft information based on the first raw data and the second raw data.

18. The flash storage system of claim 17, wherein the first soft information is further uses based on a first set of confidence values and the second soft information is further based on a second set of confidence values.

19. The flash storage system of claim 15, wherein the controller is further configured to:
issue to the decoder a first soft decoding request using the first soft information based on a first set of confidence values;
receive a first soft decoding failure indication in response to the first soft decoding request; and
issue in response to the first soft decoding failure indication, a second soft decoding request using second soft information based on the first raw data and a second set of confidence values.

20. The flash storage system of claim 15, wherein the controller is further configured to:
determine, in response to the success indication, whether requested data was successfully provided in response to the at least one soft decoding request; and
provide the decoded data when the requested data was not previously provided.

21. The flash storage system of claim 20, wherein determining whether the requested data was successfully provided comprises determining whether a success flag indicating that the requested data was provided is set.

* * * * *